United States Patent
Fan

(10) Patent No.: US 8,053,679 B2
(45) Date of Patent: Nov. 8, 2011

(54) PRINTED CIRCUIT BOARD

(75) Inventor: Fa-Ping Fan, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 454 days.

(21) Appl. No.: 12/344,250

(22) Filed: Dec. 25, 2008

(65) Prior Publication Data

US 2009/0166075 A1    Jul. 2, 2009

(30) Foreign Application Priority Data

Dec. 26, 2007  (CN) .......................... 2007 1 0203415

(51) Int. Cl.
*H05K 1/11*     (2006.01)
(52) U.S. Cl. ........................................ 174/261; 174/255
(58) Field of Classification Search .................. None
See application file for complete search history.

(56) References Cited

U.S. PATENT DOCUMENTS

| | | | |
|---|---|---|---|
| 7,301,418 B2 | 11/2007 | Kanno et al. | |
| 7,345,555 B2 * | 3/2008 | Yamanaga et al. | 333/32 |
| 7,429,902 B2 | 9/2008 | Kanno et al. | |
| 7,724,475 B2 * | 5/2010 | Nishiyama | 360/244.1 |
| 2006/0154526 A1 * | 7/2006 | Uetsuki | 439/607 |

* cited by examiner

*Primary Examiner* — Ishwarbhai Patel
(74) *Attorney, Agent, or Firm* — Altis Law Group, Inc.

(57) ABSTRACT

An exemplary printed circuit board includes a substrate, a differential transmission line, and at least two weld pad pairs. The differential transmission line and the at least two weld pad pairs are disposed on the substrate. The differential transmission line includes two parallel signal conductors disposed on the substrate. Each of the two signal conductors is electrically connected to an edge of one of the weld pads of a respective pair of the at least two weld pad pairs. Thereby, the two signal conductors of the differential transmission line can extend in the same distance anywhere, particularly in the position where the two signal conductors pass the two weld pad pairs. As a result, the coupling performance and the capability of the differential transmission line to resist electromagnetic interference are both enhanced.

6 Claims, 5 Drawing Sheets

PRINTED CIRCUIT BOARD

BACKGROUND

1. Field of the Disclosure

The present disclosure relates to printed circuit boards, and more particularly to a printed circuit board on which differential transmission lines are disposed.

2. Description of Related Art

Differential signal transmission is less prone to generate electromagnetic radiation than conventional signal transmission, and is immune to noise. Therefore, differential signal transmission is beginning to be used more and more for high-speed signal transmission in various electronic devices. Referring to FIG. 4 and FIG. 5, a printed circuit board 101 having a differential transmission line 102c is illustrated. The differential transmission line 102c includes two signal conductors 102a and 102b, which are formed parallel to each other on a top face of the printed circuit board 101. A ground conductor layer 105 is formed on a bottom face of the printed circuit board 101. High frequency signals are supplied to the two signal conductors 102a and 102b, so that they function together as parts of the differential transmission line 102c.

The signal conductor 102a and the ground conductor layer 105 constitute a first transmission line. The signal conductor 102b and the ground conductor layer 105 constitute a second transmission line. The differential transmission line 102c includes the first and second transmission lines.

The shorter the distance between the signal conductor 102a and the signal conductor 102b, the stronger the coupling which occurs between the two transmission lines of the differential transmission line 102c. Therefore in order to strengthen the coupling between the two transmission lines of the differential transmission line 102c, the gap between the signal conductor 102a and the signal conductor 102b should be reduced.

Furthermore, when the two signal conductors 102a and 102b are asymmetrically disposed on the printed circuit board 101, electromagnetic radiation generated by the differential transmission line 102c is significantly increased. Therefore when designing the differential transmission line 102c, it is best to maintain symmetry between the two signal conductors 102a and 102b along their entire lengths.

However, various complex designing requirements of the printed circuit board 101 impose limits on reducing the gap between the two signal conductors 102a and 102b, and on maintaining the symmetry between the two signal conductors 102a and 102b.

DETAILED DESCRIPTION

Figure 1:
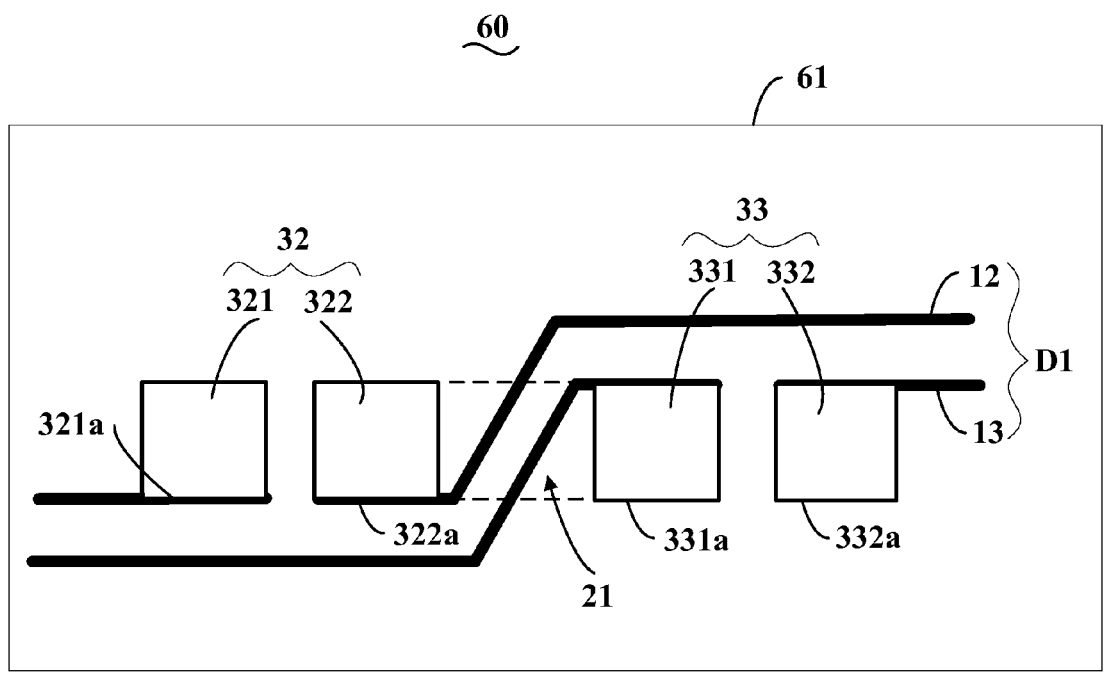
FIG. 1 is a schematic layout view showing a transmission line structure of a differential transmission line disposed on a printed circuit board in accordance with a first embodiment of the present disclosure.

FIG. 1 is a schematic layout view showing a transmission line structure of a differential transmission line disposed on a printed circuit board in accordance with a first embodiment of the present disclosure. The printed circuit board 60 includes a substrate 61, a differential transmission line D1, a first weld pad pair 32, and a second weld pad pair 33. The differential transmission line D1, the first weld pad pair 32, and the second weld pad pair 33 are disposed on the substrate 61.

The differential transmission line D1 includes a first signal conductor 12 and a second signal conductor 13 disposed parallel to each other on the substrate 61.

The first weld pad pair 32 includes a first weld pad 321 and a second weld pad 322. The second weld pad pair 33 includes a third weld pad 331 and a fourth weld pad 332. The first weld pad 321, the second weld pad 322, the third weld pad 331, and the fourth weld pad 332 are aligned in a single line. A gap is defined between each two adjacent of the weld pads 321, 322, 331, 332. In particular, a gap 21 is defined between the second weld pad 322 and the third weld pad 331. A distance between the second weld pad 322 and the third weld pad 331 is greater than that between the first and the second signal conductor 12, 13. That is, a width of the gap 21 is greater than the span between the first and second signal conductors 12, 13. The first weld pad 321 and the fourth weld pad 332 are grounded.

The weld pads 321, 322, 331, 332 can, for example, be rectangular or hexagonal in shape. In the exemplary embodiment, the weld pads 321, 322, 331, 332 are substantially square. Each of the weld pads 321, 322, 331, 332 has a first edge and a second edge at opposite sides thereof. First edges 321a, 322a, 331a, and 332a of the four weld pads 321, 322, 331, 332 are aligned in a single line.

A first segment of the first signal conductor 12 is substantially a straight line connected to an entire length of the first edge 321a and extending away from the first weld pad 321 in a direction away from the gap 21. A second segment of the first signal conductor 12 includes a first portion, a second portion, and a third portion. The first portion is substantially a straight line connected to an entire length of the first edge 322a and extending away from the second weld pad 322 partly into the gap 21. The second portion is substantially a straight line that extends obliquely from an end of the first portion through the gap 21. The third portion is substantially a straight line that extends obliquely from an end of the second portion and is parallel to the second weld pad pair 33.

The second signal conductor 13 is arranged and connected to the second weld pad pair 33 in a manner diagonally symmetric to the arrangement of the first signal conductor 12 and the connection of the first signal conductor 12 to the first weld pad pair 32.

The two weld pads 321, 322 of the first weld pad pair 32 or the two weld pads 331, 332 of the second weld pad pair 33 may be electrically connected to each other via a conductive element (not shown), such as a resistor, a capacitor, or an inductor.

With the above kind of arrangement, the two signal conductors 12 and 13 of the differential transmission line D1 can extend together in parallel any desired distance and along any desired path, particularly in positions such as where the two signal conductors 12 and 13 need to pass the two weld pad pairs 32 and 33. As a result, the coupling performance and the capability of the differential transmission line D1 to resist electromagnetic interference are both enhanced.

Figure 2:
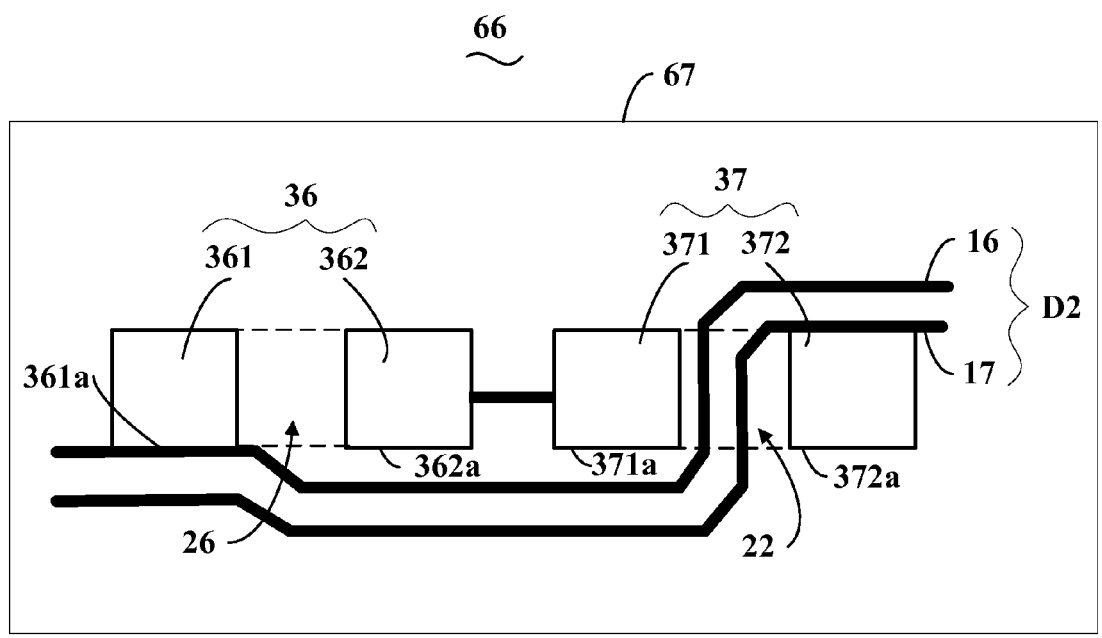
FIG. 2 is a schematic layout view showing a transmission line structure of a differential transmission line disposed on a printed circuit board in accordance with a second embodiment of the present disclosure.

FIG. 2 is a schematic layout view showing a transmission line structure of a differential transmission line disposed on a printed circuit board in accordance with a second embodiment of the present disclosure. The printed circuit board 66 includes a substrate 67, a differential transmission line D2, a first weld pad pair 36, and a second weld pad pair 37. The differential transmission line D2, the first weld pad pair 36, and the second weld pad pair 37 are disposed on the substrate 67.

The differential transmission line D2 includes a first signal conductor 16 and a second signal conductor 17 disposed parallel to each other on the substrate 67.

The first weld pad pair 36 includes a first weld pad 361 and a second weld pad 362. The second weld pad pair 37 includes a third weld pad 371 and a fourth weld pad 372. The first weld pad 361, the second weld pad 362, the third weld pad 371, and the fourth weld pad 372 are aligned in a single line. The second weld pad 362 is electrically connected to the third weld pad 371. A gap is defined between each two adjacent of the weld pads 361, 362, 371, 372. In particular, a gap 22 is defined between the third weld pad 371 and the fourth weld pad 372, and a gap 26 is defined between the first weld pad 361 and the second weld pad 362.

The weld pads 361, 362, 371, 372 can be rectangular or hexagonal in shape. In the exemplary embodiment, the weld pads 361, 362, 371, 372 are substantially square. Each of the weld pads 361, 362, 371, 372 has a first edge and a second edge at opposite sides thereof. First edges 361a, 362a, 371a and 372a of the weld pads 361, 362, 371, 372 are aligned in a single line.

The first signal conductor 16 includes a first segment, a second segment, a third segment, a fourth segment, a fifth segment, a sixth segment, and a seventh segment. The first segment is substantially a straight line connected to an entire length of the first edge 361a, and extending away from the first weld pad 361 in a direction away from the gap 26, and also extending away from the first weld pad 361 in an opposite direction partly into the gap 26. The second segment is substantially a straight line that extends obliquely from an end of the first segment. The third segment is substantially a straight line that extends obliquely from an end of the second segment and is parallel to the second weld pad 362 and the third weld pad 371. The fourth segment is substantially a straight line that extends obliquely from an end of the third segment towards the gap 22. The fifth segment is substantially a straight line that extends obliquely from an end of the fourth segment through the gap 22 in a direction that is orthogonal to the first edge 371a. The sixth segment is substantially a straight line that extends obliquely from an end of the fifth segment away from the gap 22. The seventh segment is substantially a straight line that extends obliquely from an end of the sixth segment in a direction away from the third weld pad 371 and is parallel to the fourth weld pad 372.

The second signal conductor 17 is arranged and connected to the fourth weld pad 372 in a manner diagonally symmetric to the arrangement of the first signal conductor 16 and the connection of the first signal conductor 16 to the first weld pad 361.

The two weld pads 361, 362 of the first weld pad pair 36 or the two weld pads 371, 372 of the second weld pad pair 37 are electrically connected to each other via a conductive element (not shown), such as a resistor, a capacitor, or an inductor.

With the above kind of arrangement, the two signal conductors 16 and 17 of the differential transmission line D2 can extend together in parallel any desired distance and along any desired path, particularly in positions where the two signal conductors 16 and 17 need to pass the two weld pad pairs 36 and 37. As a result, the coupling performance and the capability of the differential transmission line D2 to resist electromagnetic interference are both enhanced.

Figure 3:
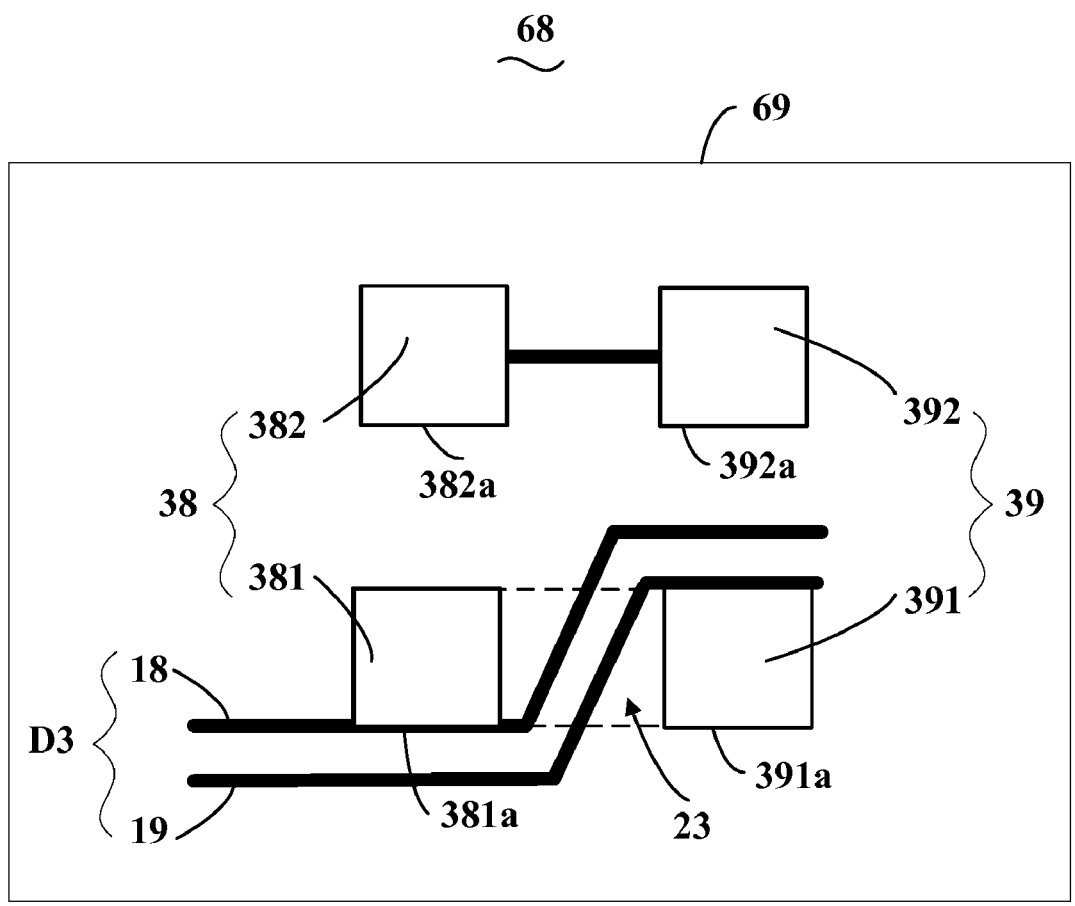
FIG. 3 is a schematic layout view showing a transmission line structure of a differential transmission line disposed on a printed circuit board in accordance with a third embodiment of the present disclosure.
Figure 4:
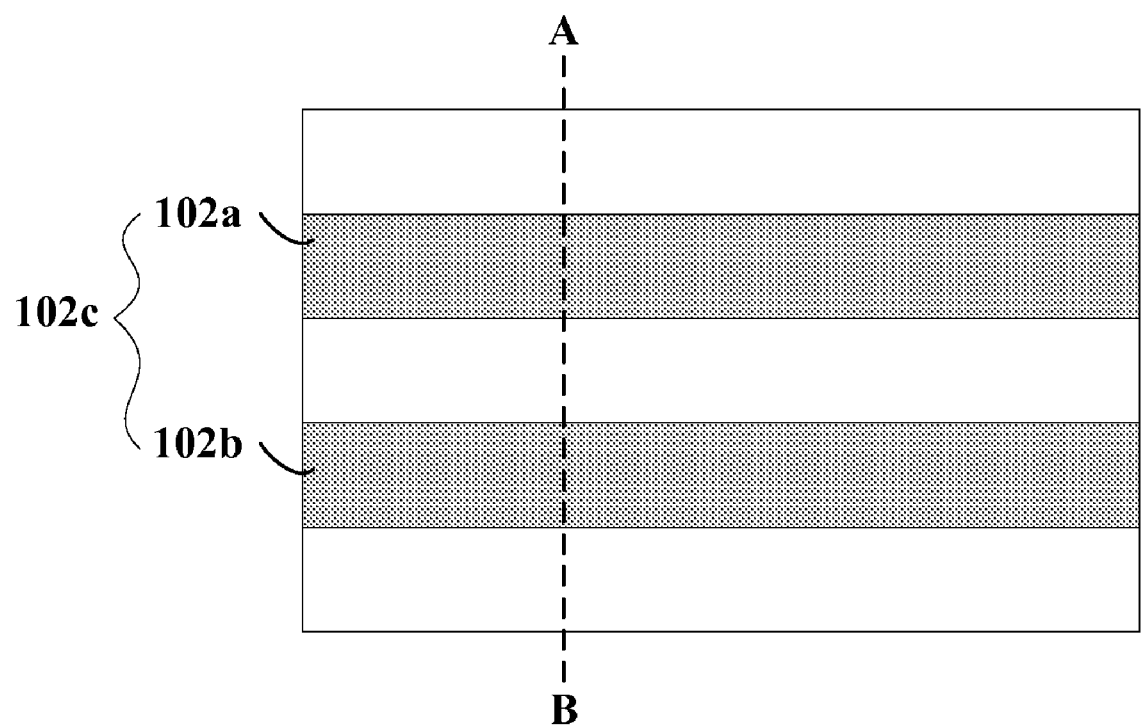
FIG. 4 is a schematic, top plan view showing a transmission line structure of a differential transmission line disposed on a printed circuit board in accordance with related art.
Figure 5:
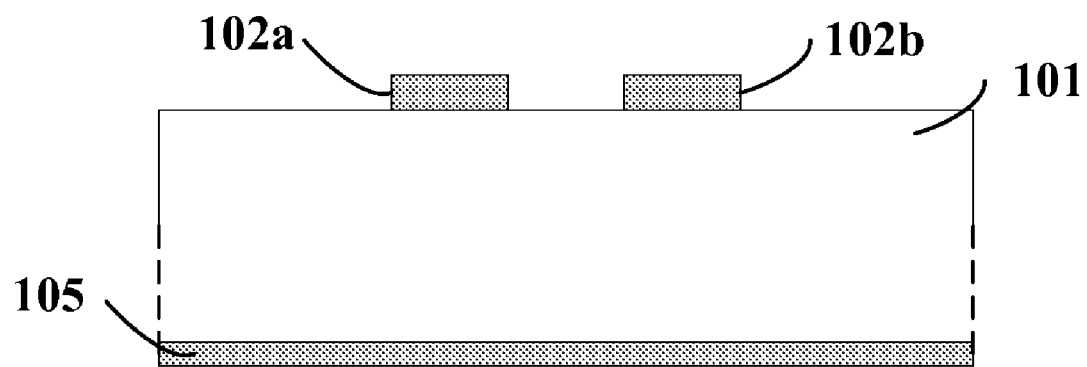
FIG. 5 is a cross-sectional view taken along line A-B of FIG. 4.

FIG. 3 is a schematic layout view showing a transmission line structure of a differential transmission line disposed on a printed circuit board in accordance with a third embodiment of the present invention. The printed circuit board 68 includes a substrate 69, a differential transmission line D3, a first weld pad pair 38, and a second weld pad pair 39. The differential transmission line D3, the first weld pad pair 38, and the second weld pad pair 39 are disposed on the substrate 69.

The differential transmission line D3 includes a first signal conductor 18 and a second signal conductor 19 disposed parallel to each other on the substrate 69.

The two weld pad pairs 38 and 39 are aligned parallel to each other. The first weld pad pair 38 includes a first weld pad 381 and a second weld pad 382. The second weld pad pair 39 includes a third weld pad 391 and a fourth weld pad 392. The first weld pad 381, the second weld pad 382, the third weld pad 391, and the fourth weld pad 392 are arranged in the form of a rectangle or a square. The second weld pad 382 is electrically connected to the fourth weld pad 392.

The weld pads 381, 382, 391, 392 can be rectangular or hexagonal in shape. In the exemplary embodiment, the weld pads 381, 382, 391, 392 are substantially square. Each of the weld pads 381, 382, 391, 392 has a first edge and a second edge at opposite sides thereof. The first edges 381a and 391a of the first weld pad 381 and the third weld pad 391 are aligned with each other. The first edges 382a and 392a of the second weld pad 382 and the fourth weld pad 392 are aligned with each other. A gap is defined between each two adjacent of the weld pads 381, 382, 391, 392. In particular, a gap 23 is defined between the first weld pad 381 and the third weld pad 391.

The first signal conductor 18 includes a first segment, a second segment, and a third segment. The first segment is substantially a straight line connected to an entire length of the first edge 381a, and extending away from the first weld pad 381 in a direction away from the gap 23, and also extending away from the first weld pad 381 in an opposite direction partly into the gap 23. The second segment is substantially a straight line that extends obliquely from an end of the first segment through the gap 23. The third segment extends obliquely from an end of the second segment and is parallel to the third weld pad 391.

The second signal conductor 19 is arranged and connected to the third weld pad 391 in a manner diagonally symmetric to the arrangement of the first signal conductor 18 and the connection of the first signal conductor 18 to the first weld pad 381.

The two weld pads of the first weld pad pair 38 or the second weld pad pair 39 are electrically connected to each other via a conductive element (not shown), such as a resistor, a capacitor, or an inductor.

With the above kind of arrangement, the two signal conductors 18 and 19 of the differential transmission line D3 can extend together in parallel any desired distance and along any desired path, particularly in positions where the two signal conductors 18 and 19 need to pass the two weld pad pairs 38 and 39. As a result, the coupling performance and the capability of the differential transmission line D3 to resist electromagnetic interference are both enhanced.

Preferably, in all of the above-described embodiments, when a segment of each of the two signal conductors of the differential transmission line obliquely extends from an adjacent segment of the signal conductor, the two segments define an angle of 135 degrees therebetween. That is, the angle at each of elbows along the signal conductor is approximately or exactly 135°.

It is to be understood, however, that even though numerous characteristics and advantages of the present embodiments have been set forth in the foregoing description, together with details of the structures and functions of the embodiments, the disclosure is illustrative only; and that changes may be made in detail, especially in matters of shape, size, and arrangement of parts within the principles of the invention to the full extent indicated by the broad general meaning of the terms in which the appended claims are expressed.

What is claimed is:

1. A printed circuit board comprising:
    a substrate;
    a differential transmission line disposed on the substrate; and
    at least two weld pad pairs disposed on the substrate;
    wherein the differential transmission line comprises two parallel signal conductors, each of the signal conductors being electrically connected to an edge of one of the weld pads of a respective pair of the at least two weld pad pairs, the two signal conductors extend obliquely through a gap defined between two adjacent weld pads of the at least two weld pad pairs.

2. The printed circuit board of claim 1, wherein each of the two signal conductors makes an angle of 135 degrees at each oblique position.

3. The printed circuit board of claim 1, wherein a width of the gap is greater than a span between the two signal conductors.

4. The printed circuit board of claim 1, wherein the at least two weld pad pairs comprise a first weld pad pair and a second weld pad pair, the first weld pad pair includes a first weld pad and a second weld pad, the second weld pad pair includes a third weld pad and a fourth weld pad, the four weld pads are aligned in a line, each of the four weld pads has a first edge and a second edge at opposite sides thereof.

5. The printed circuit board of claim 4, wherein one of the two signal conductors comprises a first segment and a second segment, the first segment is substantially a straight line connecting to an entire length of the first edge of the first weld pad and extending away from the first weld pad in a direction away from a gap defined between the second weld pad and the third weld pad, the second segment comprises a first portion, a second portion and a third portion each of which is substantially a straight line, the first portion is connected to an entire length of the first edge of the second weld pad and extends partly into the gap, the second portion extends obliquely away from an end of the first portion through the gap, the third portion extends obliquely from an end of the second portion and is parallel to the second weld pad pair.

6. The printed circuit board of claim 5, wherein the other one of the two signal conductors is arranged and connected to the second weld pad pair in a manner diagonally symmetric to the arrangement of the one of the two signal conductors and the connection of the one of the two signal conductors to the first weld pad pair.

\* \* \* \* \*